(12) United States Patent
Tsai et al.

(10) Patent No.: US 12,080,579 B1
(45) Date of Patent: Sep. 3, 2024

(54) WAFER TRANSFER DEVICE AND WAFER TRANSFER METHOD OF SEMICONDUCTOR MANUFACTURING PROCESS

(71) Applicant: SCIENTECH CORPORATION, Taipei (TW)

(72) Inventors: Wen-Ping Tsai, Taipei (TW); Tsang-Yi Wang, Taipei (TW)

(73) Assignee: SCIENTECH CORPORATION, Taipei (TW)

( * ) Notice: Subject to any disclaimer, the term of this patent is extended or adjusted under 35 U.S.C. 154(b) by 27 days.

(21) Appl. No.: 18/134,114

(22) Filed: Apr. 13, 2023

(51) Int. Cl.
*H01L 21/677* (2006.01)

(52) U.S. Cl.
CPC .............. *H01L 21/67703* (2013.01)

(58) Field of Classification Search
CPC ................................. H01L 21/67703
USPC ...................................... 206/710
See application file for complete search history.

(56) References Cited

U.S. PATENT DOCUMENTS

| | | | | |
|---|---|---|---|---|
| 4,740,135 A | * | 4/1988 | Shulenberger | H01L 21/67 414/935 |
| 5,339,128 A | * | 8/1994 | Tateyama | G03F 7/3021 396/642 |
| 2009/0053021 A1 | * | 2/2009 | Yamagishi | H01L 21/681 414/806 |
| 2020/0139503 A1 | * | 5/2020 | Kodama | B24B 7/228 |
| 2021/0242010 A1 | * | 8/2021 | Tanoue | H01L 21/02021 |

* cited by examiner

*Primary Examiner* — Jacob K Ackun
(74) *Attorney, Agent, or Firm* — Chun-Ming Shih; HDLS IPR SERVICES (57) ABSTRACT

A wafer transfer device includes a base, a plurality of fixed rings, a rotating shaft, a turntable, an air suction pump and a driving mechanism. The fixed rings are stacked sequentially and each has a channel and a ring groove. The channel is extended from an outer periphery of the fixed ring and communicates to the ring groove. The rotating shaft is connected to each fixed ring and has a plurality of flow passages corresponding to the fixed rings and communicating to the ring groove. The turntable is fixedly connected to the rotating shaft. The air suction pump sucks each wafer, and the driving mechanism drives and rotates the turntable and the rotating shaft, so that each flow passage rotates relative to each fixed ring and keeps communicating with each ring groove to maintain the suction of each wafer.

10 Claims, 10 Drawing Sheets

WAFER TRANSFER DEVICE AND WAFER TRANSFER METHOD OF SEMICONDUCTOR MANUFACTURING PROCESS

BACKGROUND OF THE DISCLOSURE

Technical Field

The technical field relates to a transfer device and a transfer method, and more particularly relates to a wafer transfer device and a wafer transfer method of a semiconductor manufacturing process.

Description of Related Art

With the rapid development of science and technology, semiconductor manufacturing processes become increasingly important. Obviously, it is extremely important for manufacturers to improve production efficiency, shorten production time and reduce production cost for related-art manufacturing processes, in addition to developing new semiconductor technologies. It will involve the transfer of wafers between different workstations due to various types and cumbersome steps of the semiconductor manufacturing processes.

However, there are often two issues regarding the transfer of wafers in the existing manufacturing processes. First, during the transfer process, the wafers are affected by the vibration, shaking, or swaying of the carrier, and thus the stability of the transfer process cannot be maintained effectively stable, which will have slight skewing and lead to scratches and damages of the wafers, or inaccurate positioning in subsequent workstations, etc. Second, most of the related-art wafer transfers rely on a six-axis robotic arm to pick up and place the wafers between each workstation, but due to the high price of the robotic arm, it cannot be used between any two workstations. Therefore, one robotic arm often needs to be responsible for the wafer transfer of many workstations, and the wafers in each workstation need to wait in line to be transferred by the robotic arm after the completion of their processing. As a result, the production efficiency is reduced and the production time is prolonged.

In view of the aforementioned problems, the inventor proposed this disclosure based on his expert knowledge and elaborated researches to overcome the problems of the related art.

SUMMARY OF THE DISCLOSURE

The primary objective of this disclosure is to enable a carrier to stably suck a plurality of wafers without losing the suction effect during the rotating and transferring processes, and to use a turntable to simultaneously transfer the wafers from different workstations to the corresponding next workstation to achieve the effects of improving production efficiency, shortening production time and lowering production cost.

To achieve the aforementioned and other objectives, this disclosure provides a wafer transfer device of a semiconductor manufacturing process for carrying a plurality of wafers, and the wafer transfer device includes a base, a plurality of fixed rings, a rotating shaft, a turntable, an air suction pump, and a driving mechanism. The base is defined with a central axis, each fixed ring is stacked along the central axis on the base, each fixed ring includes a through hole and a channel, each through hole passes through each fixed ring along the central axis, each fixed ring includes a ring groove formed along an inner rim of the corresponding through hole, and each channel is extended from the outer periphery of each fixed ring and communicates to each ring groove. The rotating shaft is rotatably connected to each through hole and includes a plurality of flow passages, each flow passage has an interface and a port, each port is arranged corresponding to each fixed ring and communicates with each corresponding ring groove, the turntable is fixedly connected to the rotating shaft, a side of the turntable away from the base is provided with a plurality of carriers, each carrier is equiangularly arranged around the rotating shaft, a top surface of each carrier is provided for carrying each wafer, each carrier includes a suction passage, two ends of each suction passage are connected to the top surface and corresponding interface of the carrier respectively, each channel is connected to each corresponding ring groove, each flow passage and each suction passage to form a plurality of air suction passages, the air suction pump is connected to each channel and provided for extracting air from each air suction passage to form a negative pressure to suck each wafer, the driving mechanism drives and rotates the turntable and rotating shaft using the central axis as an axis, and when the turntable and rotating shaft rotate, each port rotates with each corresponding fixed ring and keeps communicating with each ring groove.

In an embodiment of this disclosure, a sidewall is disposed between two ends of the rotating shaft, and each port is disposed on the sidewall.

In an embodiment of this disclosure, the rotating shaft connected to an end of the turntable has an end surface, and each interface is disposed on the end surface and arranged corresponding to each carrier.

In an embodiment of this disclosure, the wafer transfer device further includes a plurality of connecting pipes, each suction passage includes a main passage and a plurality of branches, each branch of each suction passage is parallel to the central axis and perpendicularly connected to the corresponding wafer and main passage, and two ends of each connecting pipe are connected to each interface and each main passage respectively.

In an embodiment of this disclosure, the fixed rings include a first fixed ring, the flow passages include a first flow passage, the first fixed ring is disposed on the base, the remaining fixed rings are stacked on the first fixed ring, and the port of the first flow passage communicates with the ring groove of the first fixed ring.

In an embodiment of this disclosure, the carriers are arranged correspondingly.

In an embodiment of this disclosure, the driving mechanism includes a driver, a driving gear and a driven gear, the driver has a drive shaft, the driving gear is installed to the drive shaft, the driven gear is fixedly connected to the turntable and engaged with the driving gear, the driver is provided for driving the driving gear to rotate the driven gear.

In an embodiment of this disclosure, the wafer transfer device further includes a carrying platform and a circular slide, the carrying platform is disposed on the base, the circular slide includes a rail and a slide block, the rail is installed on the carrying platform, and the slide block is installed onto the turntable and slidably sheathe the rail.

To achieve the aforementioned and other objectives, this disclosure further provides a wafer transfer method of a semiconductor manufacturing process, applied for simultaneously transferring a plurality of wafers from different workstations to the corresponding next workstation of each wafer. The wafer transfer method includes the steps of: providing a plurality of wafers, a plurality of workstations and the aforementioned wafer transfer device of the semiconductor manufacturing process, wherein the wafer transfer device includes a base, a plurality of fixed rings, a rotating shaft, a turntable, an air suction pump and a driving mechanism; the base is defined with a central axis each fixed ring is stacked on the base along the central axis and includes a through hole and a channel, each through hole passes along the central axis through each fixed ring, an inner rim of each through hole is provided with a ring groove, each channel extends from an outer periphery of each fixed ring to each ring groove; the rotating shaft is rotatably connected to each through hole and includes a plurality of flow passages, each flow passage has an interface and a port, and each port is configured to be corresponsive to each fixed ring and communicated with each corresponding ring groove; the turntable is fixedly connected to the rotating shaft, a side of the turntable away from the base is provided with a plurality of carriers, each carrier is equiangularly arranged around the rotating shaft, a top surface of each carrier is provided for carrying each wafer, each carrier has a suction passage with two ends connected to the top surface and corresponding interface of the carrier respectively, and each channel is connected to each corresponding ring groove, each flow passage and each suction passage to form a plurality of air suction passages; the air suction pump is connected to each channel for extracting air from each air suction passage to form a negative pressure in order to suck each wafer; the driving mechanism is provided for driving the turntable, the rotating shaft rotates using the central axis as an axis, when the turntable and rotating shaft rotate, each port rotates relative to each corresponding fixed ring and keeps communicating with each ring groove, each carrier carries and sucks each wafer, each workstation is arranged at a position above each carrier and a rotation angle is defined between any two adjacent carriers; and each workstation processes each wafer on each corresponding carrier; after completing the work of each workstation, the driving mechanism drives the turntable to rotate along a rotational direction to a rotation angle, such that each carrier moves to a position at the bottom of the next work station in the rotational direction; and each workstation processes each wafer on each corresponding carrier.

In the wafer transfer device of the semiconductor manufacturing process in accordance with this disclosure, when the turntable rotates, each port rotates relative to each corresponding fixed ring, and each port still keeps communicates with each ring groove, so that the carrier may stably suck the carried wafers without losing the suction effect during the processes of rotation and transfer, so as to prevent the wafers from being scratched or damaged, or unable to be positioned in subsequent workstations.

In the wafer transfer method of the semiconductor manufacturing process in accordance with this disclosure, the turntable of the wafer transfer device is provided for simultaneously transferring a plurality of wafers from different workstations to the corresponding next workstation, and thus the wafers in each workstation need not to wait sequentially for the transfer, so as to achieve the effects of greatly reducing the overall transfer time, effectively improving production efficiency, shortening production time, and lowering production cost.

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

Figure 1:
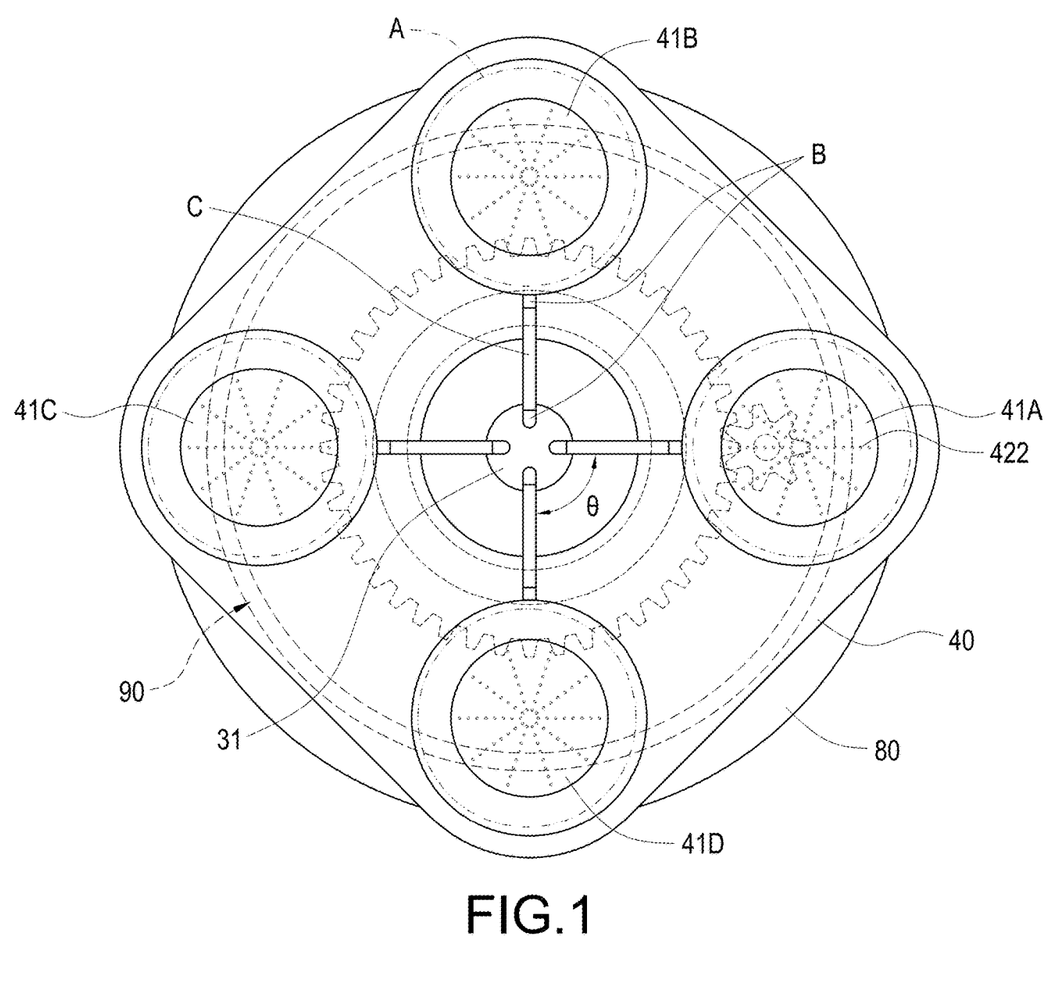
FIG. 1 is a top view of this disclosure.
Figure 2:
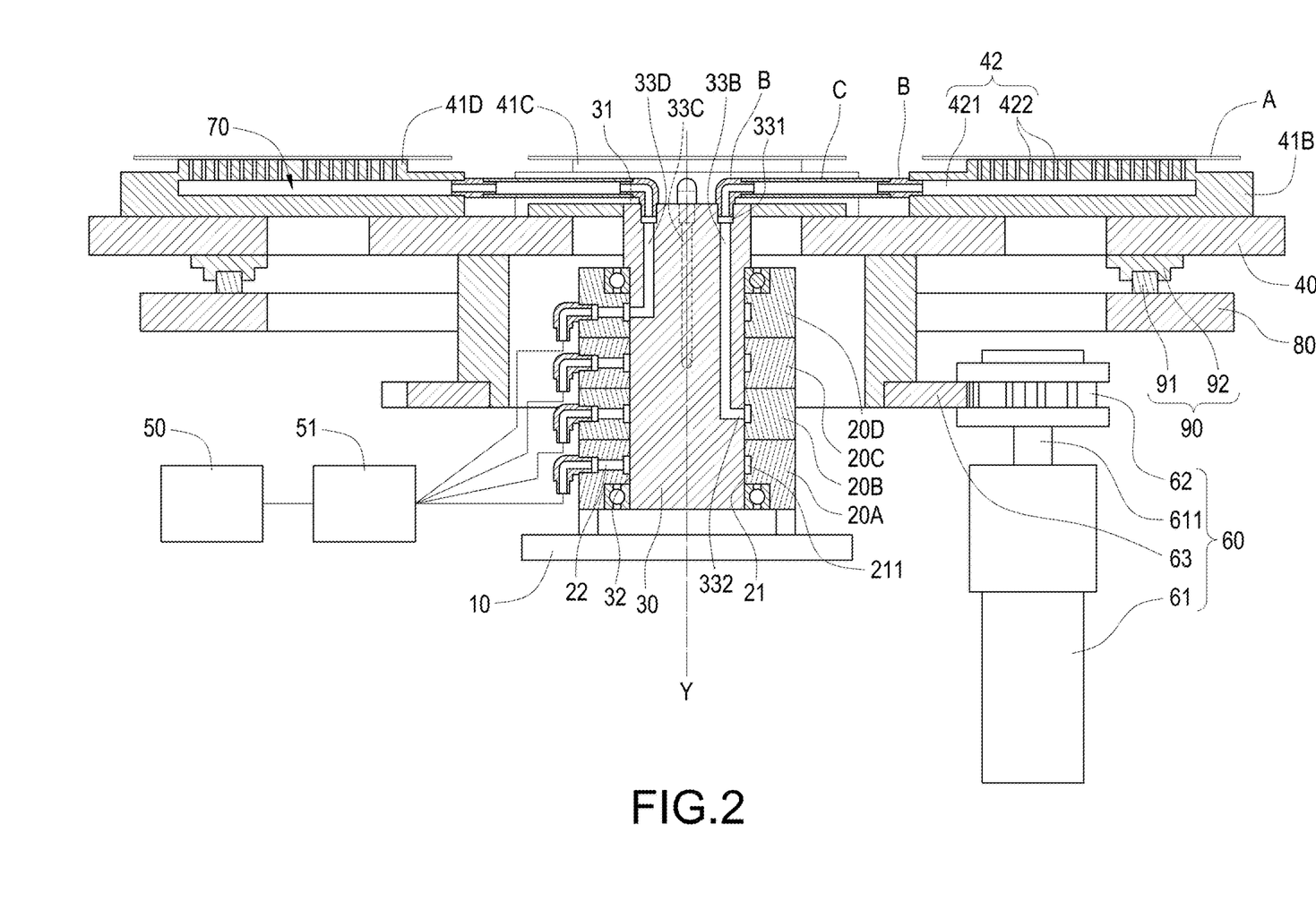
FIG. 2 is a cross-sectional view of this disclosure.
Figure 3:
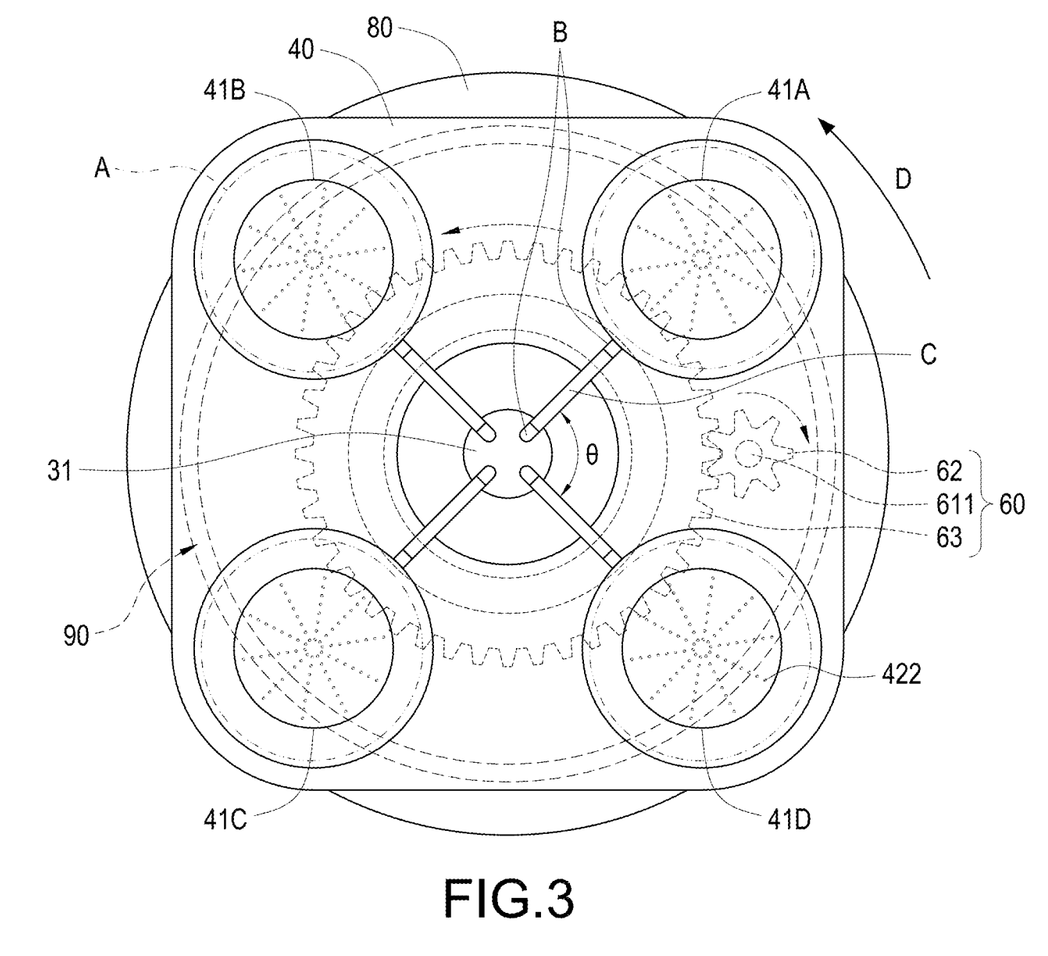
FIG. 3 is a top view showing a using status of this disclosure.

With reference to FIGS. 1 to 3 for a wafer transfer device of a semiconductor manufacturing process in accordance with this disclosure, the wafer transfer device is provided for carrying a plurality of wafers A and includes a base 10, a plurality of fixed rings 20A~20D, a rotating shaft 30, a turntable 40, an air suction pump 50 and a driving mechanism 60.

The base 10 is defined with a central axis Y. In FIG. 2, the central axis Y is extended vertically up and down and disposed at the middle of the base 10, but this disclosure is not limited to such arrangement only, for example, the central axis Y is not necessarily disposed at the middle of the base 10, as long as it is extended vertically up and down relative to the base 10. It is noteworthy that although the base 10 of this embodiment is a cuboid, the base 10 of this disclosure is not limited to this shape only, but the shape can be adjusted as needed.

In this embodiment, there are four fixed rings 20A~20D, but the quantity is not limited, for example, there may be two, three, five or more fixed rings 20A~20D depending on the requirements. Each fixed ring 20A~20D uses the central axis Y as the center and is stacked sequentially along the central axis Y on the base 10. Specifically, the fixed rings 20A~20D of this embodiment include a first fixed ring 20A, a second fixed ring 20B, a third fixed ring 20C and a fourth fixed ring 20D, the first fixed ring 20A is installed on the base, the second fixed ring 20B is stacked onto the first fixed ring 20A, the third fixed ring 20C is stacked onto the second fixed ring 20B, and the fourth fixed ring 20D is stacked onto the third fixed ring 20C. Each fixed ring 20A~20D includes a through hole 21 and a channel 22. Each through hole 21 passes along the central axis Y through each fixed ring 20A~20D, and an inner rim of each fixed ring 20A~20D is provided with a ring groove 211 along the corresponding through hole 21. Each channel 22 is extended from an outer periphery of each fixed ring 20A~20D and communicates to each ring groove 211, that is, the configuration direction of each channel 22 is perpendicular to the configuration direction of each through hole 21.

The rotating shaft 30 is in a cylindrical shape. The rotating shaft 30 is rotatably connected to each through hole 21. An end of the rotating shaft 30 is fixedly connected to the turntable 40. In this embodiment, an end of the rotating shaft 30 fixedly connected to the turntable 40 slightly protrudes from the turntable 40 and has an end surface 31, but this disclosure is not limited to such arrangement only, for example, the rotating shaft 30 is fixedly connected to an end of the turntable 40 or buried in the turntable 40 or connected to a side of the turntable 40. The rotating shaft 30 has a sidewall 32 between its two ends. The rotating shaft 30 is provided with a plurality of flow passages 33A~33D. The quantity of flow passage 33A~33D is arranged corresponding to the quantity of fixed rings 20A~20D, so that the quantity of flow passage 33A~33D in this embodiment is four. Each flow passage 33A~33D has an interface 331 and a port 332. Each interface 331 is disposed on the end surface 31 of the rotating shaft 30 and arranged corresponding to each carrier. Each port 332 is disposed on the sidewall 32 of the rotating shaft 30. Specifically, each flow passage 33A~33D is downwardly extended from the interface 331 of the end surface 31 and parallel to central axis Y and perpendicularly bent to the port 332 on the sidewall 32 to form an L-shape.

Each port 332 is arranged corresponding to each fixed ring 20A~20D and communicates with each corresponding ring groove 211. Specifically, the flow passages 33A~33D of this embodiment include a first flow passage 33A (see FIG. 4), a second flow passage 33B, a third flow passage 33C and a fourth flow passage 33D, the port 332 of the first flow passage 33A communicates to the ring groove 211 of the first fixed ring 20A, the port 332 of the second flow passage 33B communicates to the ring groove 211 of the second fixed ring 20B, the port 332 of the third flow passage 33C communicates to the ring groove 211 of the third fixed ring 20C, and the port 332 of the fourth flow passage 33D communicates to the ring groove 211 of the fourth fixed ring 20D.

A side of the turntable 40 away from the base 10 is provided with a plurality of carriers 41A~41D. The quantity of carriers 41A~41D matches the quantity of flow passages 33A~33D, so that there are four relatively configured carriers 41A~41D in this embodiment. Each carrier 41A~41D is equiangularly arranged around the rotating shaft 30, and a top surface of each carrier 41A~41D is provided for carrying each wafer A, that is, the carriers 41A~41D of this embodiment divide the turntable 40 into four equal parts. Each carrier 41A~41D has a suction passage 42. Two ends of each suction passage 42 are connected to the top surface and corresponding interface 331 of the carrier 41A~41D. Each channel 22 is connected to each corresponding ring groove 211, each flow passage 33A~33D and each suction passage 42 to form a plurality of air suction passages 70. Specifically, the air suction passages 70 include a first air suction passage (not labelled in the figures), a second air suction passage (not labelled in the figures), a third air suction passage (not labelled in the figures) and a fourth air suction passage (not labelled in the figures).

The first air suction passage is formed by the channel 22 of the first fixed ring 20A, the ring groove 211 of the first fixed ring 20A, the first flow passage 33A and the corresponding suction passage 42 of the first flow passage 33A. The second air suction passage is formed by the channel 22 of the second fixed ring 20B, the ring groove 211 of the second fixed ring 20B, the second flow passage 33B and the corresponding suction passage 42 of the second flow passage 33B. The third air suction passage is formed by the channel 22 of the third fixed ring 20C, the ring groove 211 of the third fixed ring 20C, the third flow passage 33C and the corresponding suction passage 42 of the third flow passage 33C. The fourth air suction passage is formed by the channel 22 of the fourth fixed ring 20D, the ring groove 211 of the fourth fixed ring 20D, fourth flow passage 33D and the corresponding suction passage 42 of the fourth flow passage 33D.

For the convenience of describing the specification of this disclosure, each carrier 41A~41D is further defined. The first air suction passage corresponding to the first flow passage 33A is referred to as a first carrier 41A, the second air suction passage corresponding to the second flow passage 33B is referred to as a second carrier 41B, the third air suction passage corresponding to the third flow passage 33C is referred to as a third carrier 41C, and the fourth air suction passage corresponding to the fourth flow passage 33D is referred to as a fourth carrier 41D.

The air suction pump 50 is connected to each channel 22. In this embodiment, there is one air suction pump 50, which communicates to each channel 22 through a control valve 51 and is used for controlling the air extraction of each channel, but this disclosure is not limited to such arrangement only, for example, the quantity of air suction pumps 50 may also be corresponding to the quantity of channels 22 and each air suction pump 50 is used directly to extract air for each channel 22. Specifically, the air suction pump 50 of the embodiment may use the control valve 51 to extract air from each air suction passage as needed to form a negative pressure to suck each wafer A on each carrier 41A~41D.

The driving mechanism 60 is provided for driving and rotating the turntable 40 and rotating shaft 30 using the central axis Y as an axis. The driving mechanism 60 of this embodiment includes a driver 61 (which may be a servomotor or stepper motor), a driving gear 62 and a driven gear 63. The driver 61 has a drive shaft 611. The driving gear 62 is installed on the drive shaft 611. The drive gear 63 is fixed on the turntable 40 and engaged with the driving gear 62. The driver 61 is provided for driving and rotating the drive shaft 611, so as to rotate the driving gear 62, and drive the driving gear 62 to rotate the driven gear 63 altogether. As a result, the turntable 40 and the rotating shaft 30 may rotate with the driven gear 63 to achieve the effect of rotating the turntable 40. It is noteworthy that the driver 61 of this disclosure adopts a servomotor or stepper motor, so that the rotation angle of the drive shaft 611 may be controlled to accurately control the rotation angle of the turntable 40.

When the turntable 40 and the rotating shaft 30 are driven by the driving mechanism 60 to rotate, each port 332 of each flow passage 33A~33D also rotates relative to each corresponding fixed ring 20A~20D, and each port 332 may still keep communicating with each ring groove 211 to achieve the effect of continuously sucking each wafer A on each carrier 41A~41D.

With reference to FIG. 2 for a wafer transfer device of a semiconductor manufacturing process in accordance with this disclosure, the wafer transfer device further includes a plurality of connectors B and a plurality of connecting pipes C. Each suction passage 42 includes a main passage 421 and a plurality of branches 422. Each branch 422 of each suction passage 42 is parallel to the central axis Y and perpendicularly connected to the corresponding wafer A and the main passage 421. Two ends of each connecting pipe C are connected to each interface 331 and each main passage 421 respectively. Specifically, an end of each main passage 421 away from each branch 422, each interface 331 and each port 332 are provided with a connector B. Therefore, a part of the connecting pipe C is connected between each interface 331 and each connector B of each main passage 421, and another part of the connecting pipe C is connected between each port 332 and the control valve 51 of the air suction pump 50 to effectively ensure the sealing to achieve a good negative pressure effect.

In some embodiments of this disclosure, the wafer transfer device further includes a carrying platform 80 and a circular slide 90. In this embodiment, the carrying platform 80 is connected to the base 10 for supporting the turntable 40, but this disclosure is not limited to such arrangement. The circular slide 90 includes a rail 91 and a slide block 92. The rail 91 is arranged on the carrying platform 80, the slide block 92 is disposed at the bottom of the turntable 40 and slidably sheathe the rail 91. In this way, the turntable 40 may stably rotate relative to the carrying platform 80 through the positioning between the slide block 92 and the rail 91 without any deviation or skew, thereby ensuring a stable transfer of each wafer A.

In the wafer transfer device of the semiconductor manufacturing process in accordance with this disclosure, when the turntable 40 rotates, each port 332 rotates relative to each corresponding fixed ring 20A~20D, and each port 332 still keeps communicating with each ring groove 221, so that the carriers 41A~41D may stably suck the carried wafers A without losing the suction effect during the rotating and transferring process, so as to prevent the wafers A from scratching or damaging or unable to be positioned in subsequent workstations.

Figure 4:
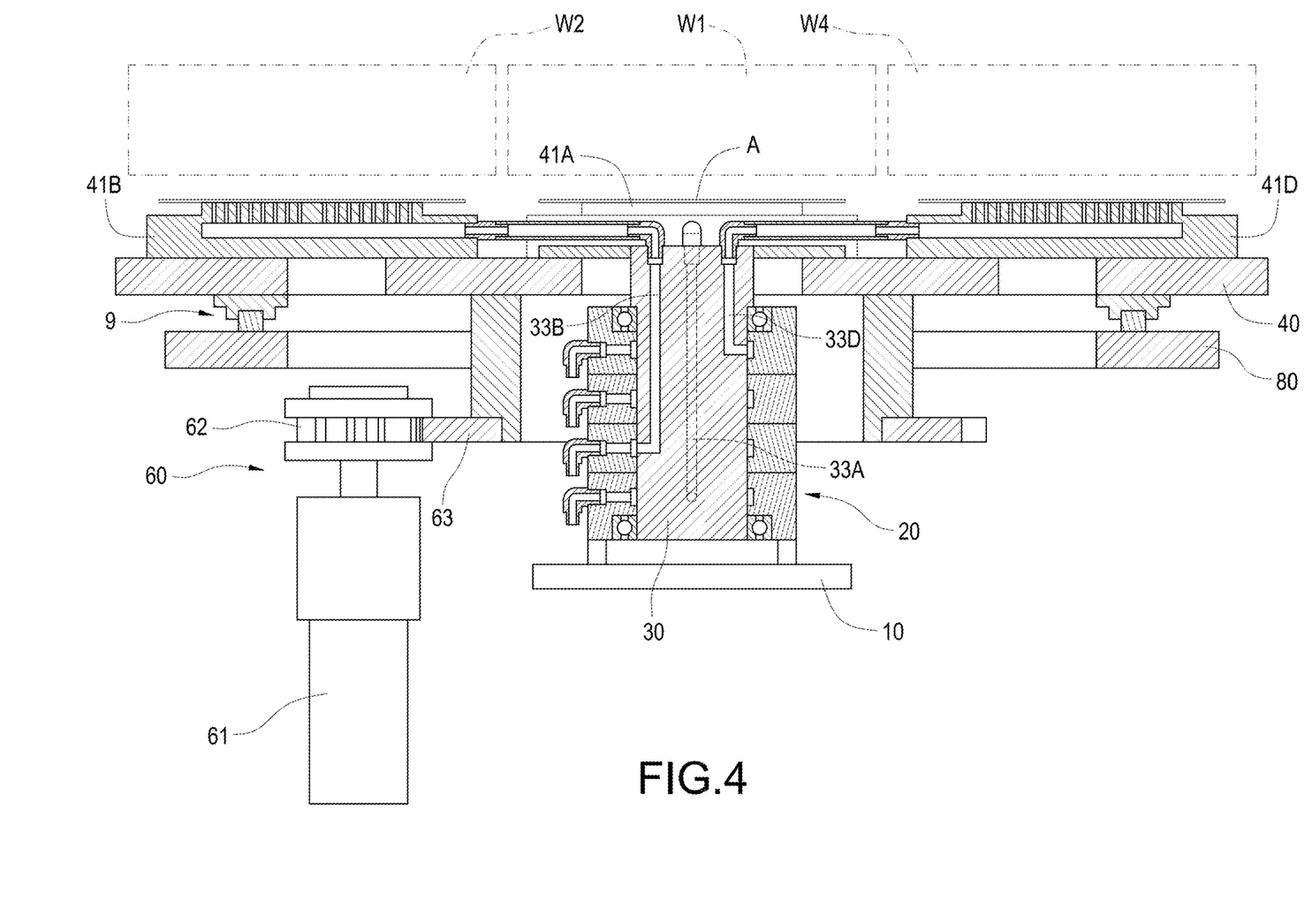
FIG. 4 is a cross-sectional view of this disclosure applied to a plurality of workstations.
Figure 5:
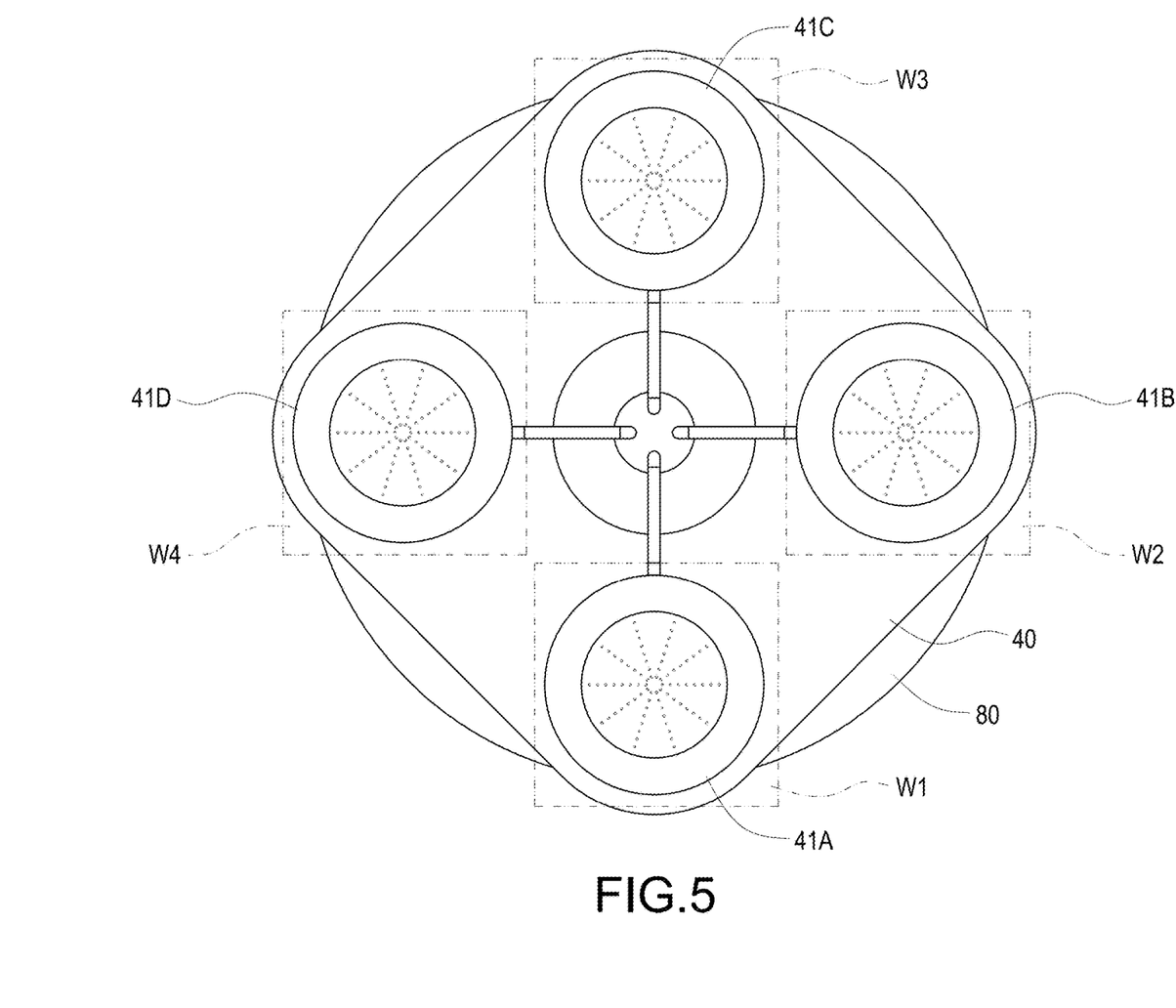
FIG. 5 is a first processing diagram of a transfer method of this disclosure applied to a plurality of workstations.

With reference to FIGS. 4 and 5 for a wafer transfer method of a semiconductor manufacturing process in accordance with this disclosure, the wafer transfer method is applied for simultaneously transferring a plurality of wafers from different workstations W1~W4 to the corresponding next workstation W1~W4 of each wafer, and the wafer transfer method includes the following steps.

The aforementioned plurality of wafers A, a plurality of workstations W1~W4, and the aforementioned wafer transfer device for the semiconductor manufacturing process are provided. Each carrier 41A~41D is provided for carrying and sucking each corresponding wafer A. Each workstation W1~W4 is arranged above each carrier 41A~41D, and a rotation angle θ is defined between any two adjacent carriers 41A~41D.

The work of each wafer A on each corresponding carrier 41A~41D in each workstation W1~W4 is performed.

After each workstation W1~W4 completes its work, the driving mechanism 60 drives the turntable 40 to rotate along a rotational direction D to the aforementioned rotation angle θ, so that each carrier 41A~41D moves to the bottom of the next workstation W1~W4 of the rotational direction D.

Each workstation W1~W4 processes each wafer A on each corresponding carrier 41A~41D. Further, the quantity of workstations W1~W4 matches with the quantity of carriers 41A~41D, so that there are four workstations W1~W4 of this embodiment. Specifically, the workstations W1~W4 include a first workstation W1, a second workstation W2, a third workstation W3 and a fourth workstation W4 for carrying out different work. For example, the first workstation W1 carries out the feeding work (that is, placing the wafers A into position manually or by machine), the second workstation W2 and the third workstation W3 perform the manufacturing work (such as coating, laminating, stripping, etching, developing, polishing grinding, etc., of the wafer A), the fourth workstation W4 inspects the output (that is, to classify and collect good and defective products manually or by machine), but the quantity and work content of these workstations W1~W4 are not limited to the above arrangement, and adjustments may be made as needed With reference to FIGS. 5 to 10 for the above embodiments, the transfer flow of this disclosure is described below:

In the initial state as shown in FIG. 5, the first carrier 41A is situated at the bottom of the first workstation W1, the second carrier 41B is situated at the bottom of the second workstation W2, the third carrier 41C is situated at the bottom of the third workstation W3, the fourth carrier 41D is situated at the bottom of the fourth workstation W4, and each carrier 41A~41D has not yet carried any wafer A.

Figure 6:
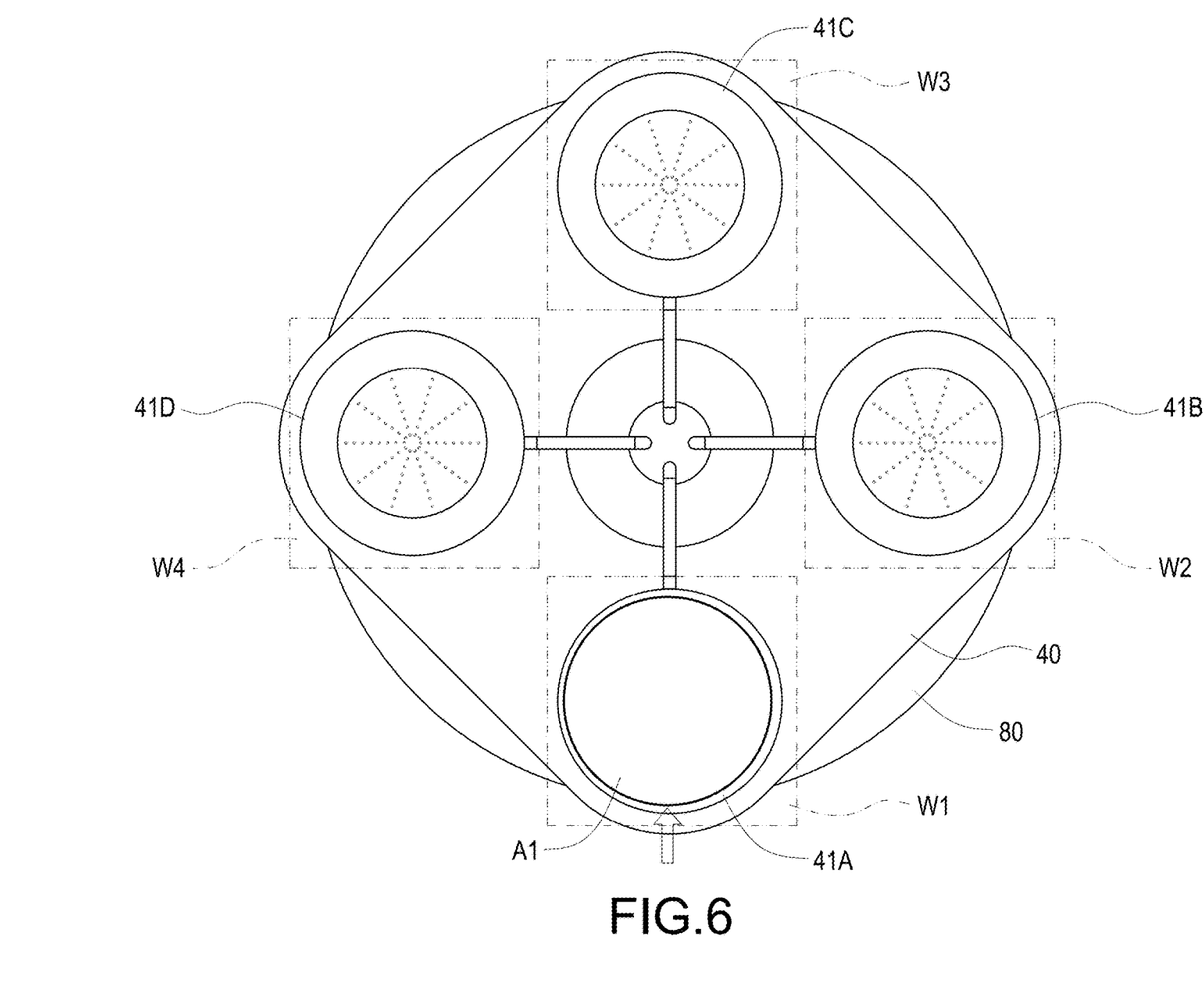
FIG. 6 is a second processing diagram of a transfer method of this disclosure applied to a plurality of workstations.

In FIG. 6, the first workstation W1 places the first wafer A1 onto the first carrier 41A.

Figure 7:
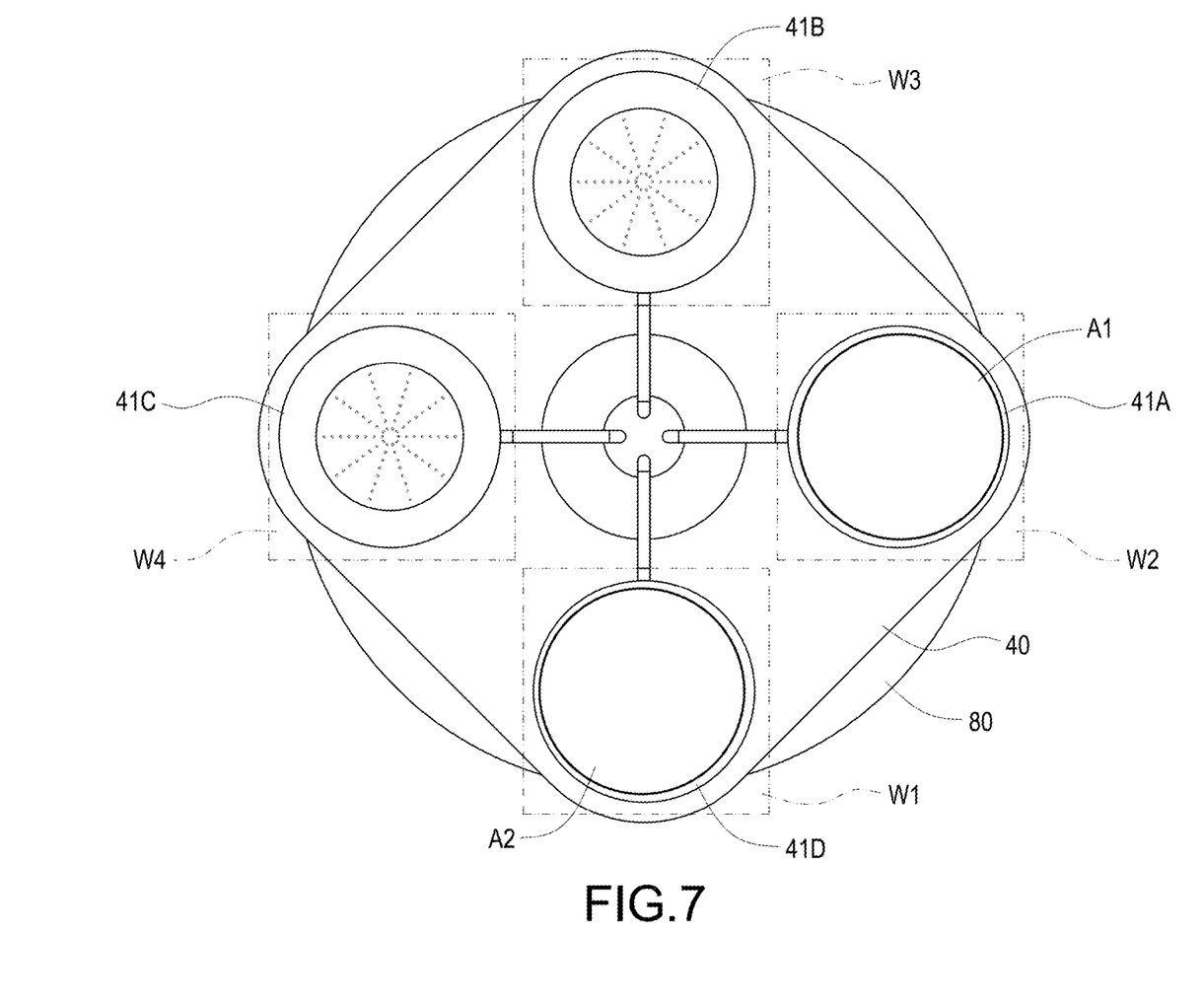
FIG. 7 is a third processing diagram of a transfer method of this disclosure applied to a plurality of workstations.

In FIG. 7, the turntable 40 rotates along the rotational direction D to the aforementioned rotation angle θ, so that the first carrier 41A is situated at the bottom of the second workstation W2, the second carrier 41B is situated at the bottom of the third workstation W3, the third carrier 41C is situated at the bottom of the fourth workstation W4, and the fourth carrier 41D is situated at the bottom of the first workstation W1. The first workstation W1 places the second wafer A2 on the fourth carrier 41D, and the second workstation W2 processes the first wafer A1 on the first carrier 41A.

Figure 8:
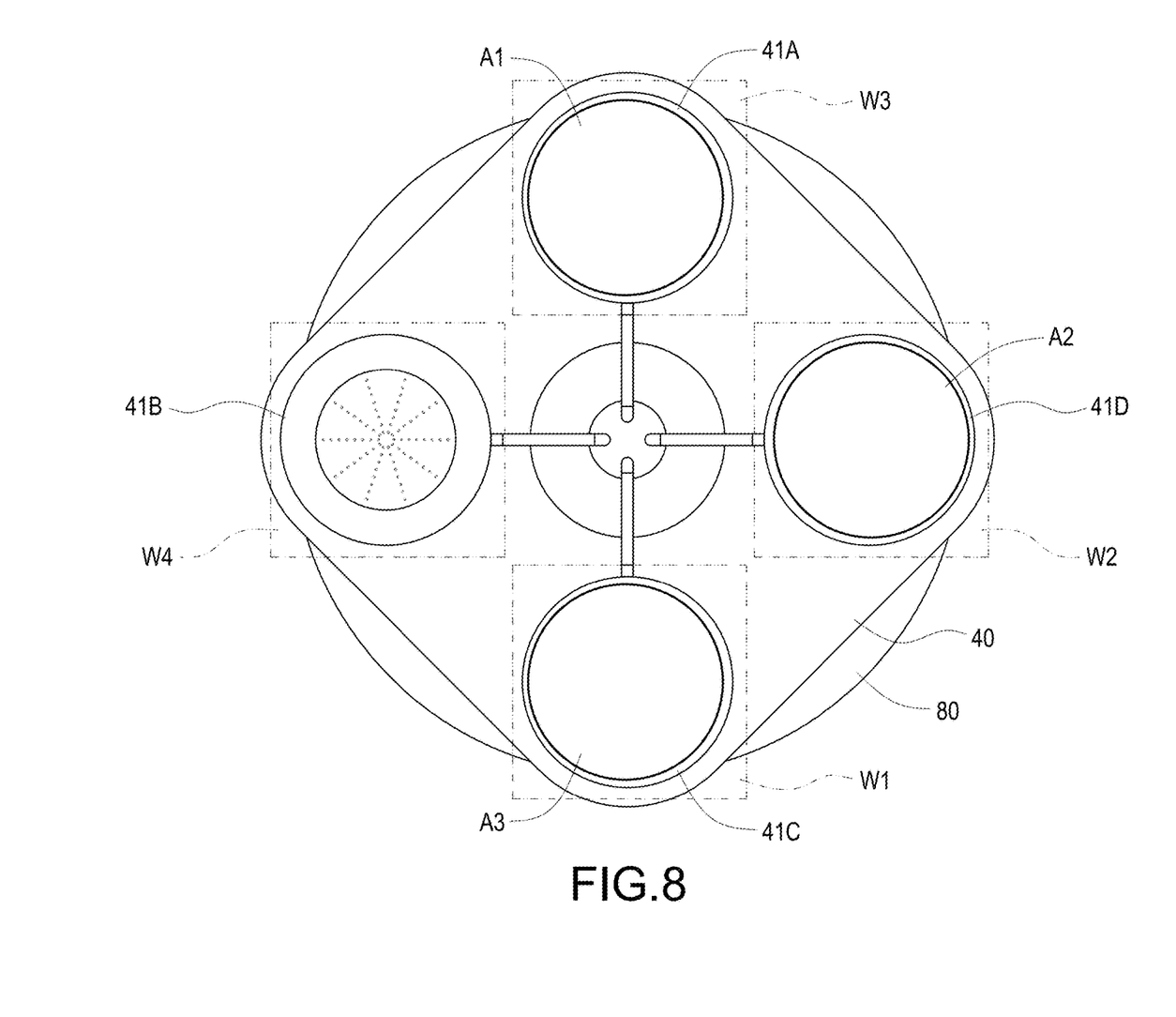
FIG. 8 is a fourth processing diagram of a transfer method of this disclosure applied to a plurality of workstations.

In FIG. 8, after the first workstation W1 and second workstation W2 complete their own work, the turntable 40 rotates along the rotational direction D to the aforementioned rotation angle θ, so that the first carrier 41A is situated at the bottom of the third workstation W3, the second carrier 41B is situated at the bottom of the fourth workstation W4, the third carrier 41C is situated at the bottom of the first workstation W1, the fourth carrier 41D is situated at the bottom of the second workstation W2. The first workstation W1 places the third wafer A3 onto the third carrier 41C, the second workstation W2 processes the second wafer A2 on the fourth carrier 41D, the third workstation W3 processes the first wafer A1 on the first carrier 41A.

Figure 9:
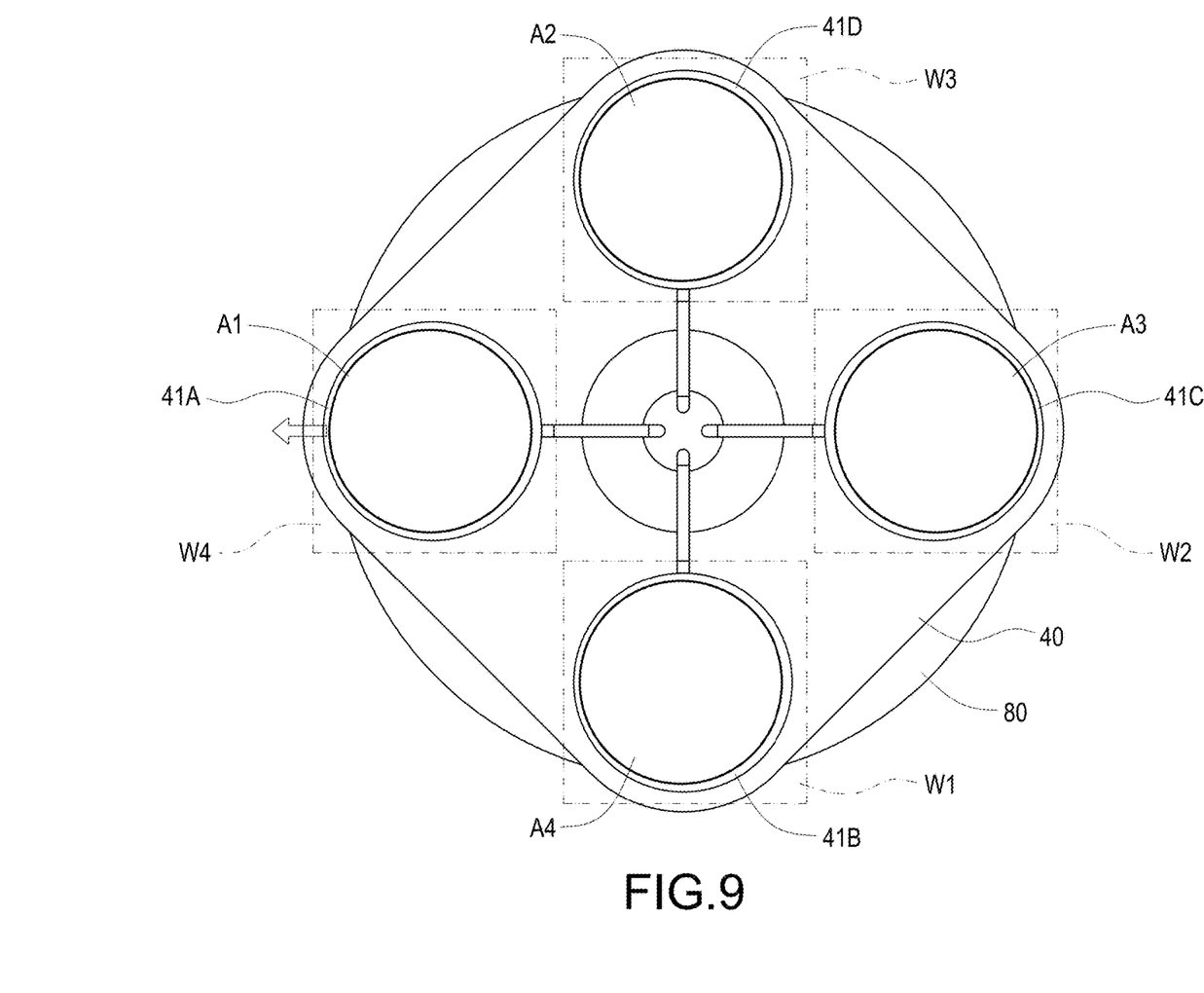
FIG. 9 is a fifth processing diagram of a transfer method of this disclosure applied to a plurality of workstations.

In FIG. 9, after the first workstation W1, second workstation W2 and third workstation W3 complete their own work, the turntable 40 rotates along the rotational direction D to the aforementioned rotation angle θ, so that the first carrier 41A is situated at the bottom of the fourth workstation W4, the second carrier 41B is situated at the bottom of the first workstation W1, the third carrier 41C is situated at the bottom of the second workstation W2, and the fourth carrier 41D is situated at the bottom of the third workstation W3. The first workstation W1 places the fourth wafer A4 onto the second carrier 41B, the second workstation W2 processes the third wafer A3 on the third carrier 41C, the third workstation W3 processes the second wafer A2 on the fourth carrier 41D, and the fourth workstation W4 inspects and classifies the first wafer A1 on the first carrier 41A.

Figure 10:
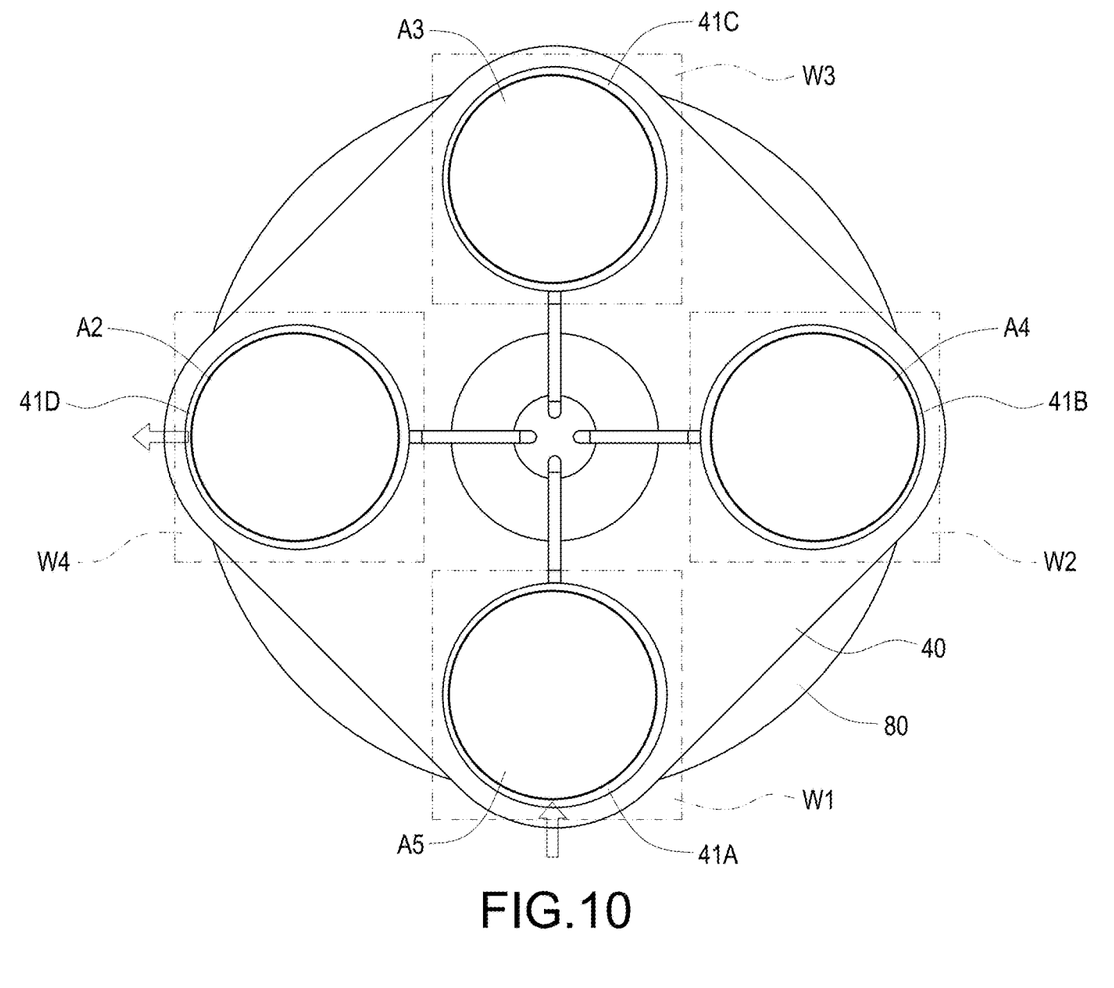
FIG. 10 is a sixth processing diagram of a transfer method of this disclosure applied to a plurality of workstations.

In FIG. 10, after the first workstation W1, second workstation W2, third workstation W3 and fourth workstation W4 complete their own work, the turntable 40 rotates along the rotational direction D to the aforementioned rotation angle θ, so that the first carrier 41A returns to the position below the first workstation W1, the second carrier 41B returns to the position below the second workstation W2, the third carrier 41C returns to the position below the third workstation W3, and the fourth carrier 41D returns to the position below the fourth workstation W4. The fifth wafer A5 in the first workstation W1 is placed on the first carrier 41A, the second workstation W2 processes the fourth wafer A4 on the second carrier 41B, the third workstation W3 processes the third wafer A3 on the third carrier 41C, and the fourth workstation W4 inspects and classifies the second wafer A2 on the fourth carrier 41D.

In this way, the first workstation W1 may continuously input new wafers A and manufacture the wafers A through the processing work of the second workstation W2 and the third workstation W3, and then the fourth workstation W4 detects and classifies the manufactured wafers A. At the same time, each wafer A on each carrier 41A~41D is transferred by the rotation of the turntable 40 and simultaneously moves to the next workstation W1~W4 along the rotational direction D respectively to form a continuous production flow, thereby achieving the effects of greatly reducing the transfer time of each wafer A between different workstations W1~W4, improving production efficiency and lowering production cost.

Based on the wafer transfer method for the semiconductor manufacturing process of this disclosure, the wafers A of different workstations W1~W4 are simultaneously transferred to the corresponding next workstation W1~W4 through the turntable 40 of the wafer transfer device, so that the wafers A in each workstation W1~W4 need not to wait for transfer in sequence after its manufacture, so as to achieve the effects of greatly reducing the overall transfer time, effectively improving production efficiency, shortening production time and lowering production cost.

While this disclosure has been described by means of specific embodiments, numerous modifications and variations could be made thereto by those skilled in the art without departing from the scope and spirit of this disclosure set forth in the claims.

What is claimed is:

1. A wafer transfer device of a semiconductor manufacturing process, for carrying a plurality of wafers, and the wafer transfer device comprising:
    a base, defined with a central axis;
    a plurality of fixed rings, stacked on the base along the central axis, each fixed ring comprising a through hole and a channel, each through hole passing through each fixed ring along the central axis, a ring groove disposed in each fixed ring along an inner rim of the through hole, and the channel extended from an outer periphery of each fixed ring and communicating to the ring groove;
    a rotating shaft, rotatably coupled to each through hole, and comprising a plurality of flow passages, each flow passage comprising an interface and a port, and the port arranged corresponding to each fixed ring and communicating with the ring groove;
    a turntable, fixedly connected to the rotating shaft, and comprising a plurality of carriers disposed on a side thereof away from the base, each carrier equiangularly installed around the rotating shaft, a top surface of each carrier carrying each wafer, each carrier comprising a suction passage, two ends of each suction passage coupled to the top surface of the carrier and the interface correspondingly, a plurality of channels correspondingly communicating with a plurality of ring grooves, the flow passages and the suction passages to define a plurality of air suction passages;
    an air suction pump, coupled to each channel, and configured to extract air from each air suction passage to form a negative pressure to suck each wafer; and
    a driving mechanism, configured to drive the turntable and the rotating shaft to rotate around the central axis;
    wherein, when the turntable and the rotating shaft rotate, the port rotates relative to each fixed ring and keeps communicating with each ring groove.

2. The wafer transfer device according to claim 1, wherein the rotating shaft comprises a sidewall between two ends thereof, and the port is disposed on the sidewall.

3. The wafer transfer device according to claim 1, wherein the rotating shaft comprises an end surface coupled to an end of the turntable, and the interface is disposed on the end surface and arranged corresponding to each carrier.

4. The wafer transfer device according to claim 1, wherein each suction passage comprises a main passage and a plurality of branches, each branch of each suction passage is parallel to the central axis and perpendicularly coupled to each wafer and the main passage.

5. The wafer transfer device according to claim 4, further comprising a plurality of connecting pipes, and two ends of each connecting pipe coupled to the interface and the main passage respectively.

6. The wafer transfer device according to claim 1, wherein the fixed rings comprise a first fixed ring, the flow passages comprise a first flow passage, the first fixed ring is installed on the base, rest of the fixed rings are stacked on the first fixed ring, and the port of the first flow passage communicates to the ring groove of the first fixed ring.

7. The wafer transfer device according to claim 1, wherein the carriers are arranged correspondingly.

8. The wafer transfer device according to claim 1, wherein the driving mechanism comprises a driver, a driving gear and a driven gear, the driver comprises a drive shaft, the driving gear is installed to the drive shaft, the driven gear is fixedly connected to the turntable and engaged with the driving gear, and the driver is configured to drive the driving gear to rotate the driven gear.

9. The wafer transfer device according to claim 1, further comprising a carrying platform and a circular slide, the carrying platform arranged on the base, the circular slide comprising a rail and a slide block, the rail arranged on the carrying platform, and the slide block arranged on the turntable and adapted to slidably sheathe the rail.

10. A wafer transfer method of a semiconductor manufacturing process, for simultaneously transferring a plurality of wafers from different workstations to next workstation of each wafer, the wafer transfer method comprising:
    providing a plurality of wafers, a plurality of workstations and the wafer transfer device according to claim 1, wherein each carrier carries and sucks each wafer, each workstation is situated at top of each carrier, and a rotation angle is defined between any two adjacent carriers;
    processing each wafer on each carrier in each workstation;
    after completing work in each workstation, driving, by the driving mechanism, the turntable to rotate along a rotational direction with the rotation angle to make each carrier move below next workstation at the rotational direction; and
    processing each wafer on each carrier in each workstation.

* * * * *